United States Patent
Kwon

(10) Patent No.: US 8,354,672 B2
(45) Date of Patent: Jan. 15, 2013

(54) THIN FILM TRANSISTOR ARRAY PANEL

(75) Inventor: Ho-Kyoon Kwon, Seoul (KR)

(73) Assignee: Samsung Display Co., Ltd. (KR)

( * ) Notice: Subject to any disclaimer, the term of this patent is extended or adjusted under 35 U.S.C. 154(b) by 315 days.

(21) Appl. No.: 12/829,272

(22) Filed: Jul. 1, 2010

(65) Prior Publication Data

US 2011/0089423 A1    Apr. 21, 2011

(30) Foreign Application Priority Data

Oct. 15, 2009    (KR) .................. 10-2009-0098339

(51) Int. Cl.
*H01L 29/04* (2006.01)

(52) U.S. Cl. ..... 257/59; 257/72; 257/459; 257/E23.179; 257/E29.273

(58) Field of Classification Search ............ 257/59, 257/72, 459, E23.179, E29.273
See application file for complete search history.

(56) References Cited

U.S. PATENT DOCUMENTS

2005/0174501 A1 * 8/2005 Yoo et al. .................. 349/43

FOREIGN PATENT DOCUMENTS

| JP | 07-235567 | 9/1995 |
| JP | 07-294955 | 11/1995 |
| JP | 2002-344097 | 11/2002 |
| JP | 2005-283830 | 10/2005 |
| KR | 1020030053186 A | 6/2003 |
| KR | 1020040017638 A | 2/2004 |
| KR | 1020050002565 A | 1/2005 |

* cited by examiner

*Primary Examiner* — Andy Huynh
(74) *Attorney, Agent, or Firm* — Innovation Counsel LLP

(57) ABSTRACT

A thin film transistor array panel can include: a substrate; a gate line formed on the substrate; a gate pad formed at an end of the gate line; a gate identification member corresponding to the gate pad and formed in the same layer as the gate pad; a gate insulating layer covering the gate line and the gate identification member; a data line formed on the gate insulating layer; a passivation layer formed on the gate insulating layer and the data line; a gate contact assistant formed on the passivation layer; and a gate driving chip electrically connected to the gate contact assistant, wherein the gate contact assistant at least partially overlaps the gate identification member. The gate identification member is formed without producing a step in the gate contact assistant, reducing the risk of defects when wires or other objects are pressed onto the gate pad.

20 Claims, 5 Drawing Sheets

THIN FILM TRANSISTOR ARRAY PANEL

CROSS-REFERENCE TO RELATED APPLICATION

This application claims priority to, and the benefit of, Korean Patent Application No. 10-2009-0098339 filed in the Korean Intellectual Property Office on Oct. 15, 2009, the entire contents of which are incorporated herein by reference.

BACKGROUND OF THE INVENTION (a) Field of the Invention

The present invention relates to a thin film transistor array panel.

(b) Description of the Related Art

Liquid crystal displays (LCDs) are among the most widely used flat panel displays. A typical LCD includes a pair of panels provided with field-generating electrodes, and a liquid crystal (LC) layer interposed therebetween. The LCD displays images by applying voltages to the field-generating electrodes to generate an electric field in the LC layer. This field orients the LC molecules, which polarizes incident light.

One widely employed LCD structure utilizes field generating electrodes respectively formed on two display panels. A plurality of pixel electrodes are arranged in a matrix format on one display panel, and one common electrode covers the surface of the other display panel. In the liquid crystal display, each pixel electrode is separately applied with a voltage to display images. A thin film transistor (TFT) is connected to each pixel electrode for switching the voltage applied to the pixel electrode, as well as a plurality of gate lines transmitting signals to control the thin film transistor, and a plurality of data lines transmitting the voltage that is applied to the pixel electrode.

The thin film transistor array panel is controlled by a driving circuit connected to the gate line and the data line. The driving circuit may be attached to the panel by a tape carrier package (TCP) type structure, or a chip-on-glass (COG) type structure. With the TCP type structure, a tape mounted with the driving chip is separately attached to the thin film transistor array panel, whereas with the COG type structure, the driving chip is directly mounted on an insulation substrate of the thin film transistor array panel. Conventionally, TCP type structures have been more widely used. However, the COG type structure has recently gained popularity due to its smaller footprint and lower cost. Also, TCP type structures typically require an additional circuit for applying signals to their driving circuits. This added circuit must be formed on an additional printed circuit board (PCB), and connected through an additional flexible printed circuit (FPC) film.

In COG type thin film transistor array panels, to easily confirm a defect in wiring when inspecting for defects, an identification number is given to each gate pad and each data pad (i.e., the pads connected to a gate driving chip and a data driving chip, respectively).

However, as components have become more highly integrated, the interval between the plurality of gate pads or the plurality of data pads has shrunk to the point that it is difficult to form these identification numbers.

When an identification number is not formed between the gate pads or the data pads, it is difficult to find and keep track of defective wiring. Also, if the identification number partially overlaps the gate pad and is formed with a different material from the gate pad, a step is generated at the overlap. This partial overlap is more likely to generate defects during pressing of bond wires onto the pads. One approach to overcoming this problem is to form small identification numbers in the narrow spaces between neighboring pads. However, these numbers are often too small to read easily, and also risk shorting their adjacent pads to each other.

The above information disclosed in this Background section is only for enhancement of understanding of the background of the invention. Therefore, it may contain information not in the prior art and not already known to a person of ordinary skill in the art.

SUMMARY OF THE INVENTION

The present invention easily executes defect inspection and prevents defects in a press process between the pad and the driving chip.

A thin film transistor array panel according to an exemplary embodiment of the present invention includes: a substrate; a gate line formed on the substrate; a gate pad formed at an end of the gate line; a gate identification member corresponding to the gate pad and formed in the same layer as the gate pad; a gate insulating layer covering the gate line and the gate identification member; a data line formed on the gate insulating layer; a passivation layer formed on the gate insulating layer and the data line; a gate contact assistant formed on the passivation layer; and a gate driving chip electrically connected to the gate contact assistant, wherein the gate contact assistant at least partially overlaps the gate identification member.

A contact hole may be formed in the gate insulating layer and the passivation layer, and the gate pad may be connected to the gate contact assistant through the gate contact hole.

The gate identification member may comprise the same material as the gate pad.

The gate identification member may comprise an identification number.

The gate identification member may be oriented along a major axis of the gate pad.

A data contact assistant formed on the passivation layer and a data identification member corresponding to the data pad and formed in the same layer as the data pad may be further included, wherein the data contact assistant at least partially overlaps the data identification member.

A data driving chip electrically connected to the data contact assistant may be further included, and the passivation layer may have a data contact hole formed therein.

The data pad may be connected to the data contact assistant through the data contact hole.

The data identification member may comprise the same material as the data pad.

The data identification member may comprise an identification number.

The data identification member may be oriented along a major axis of the data pad.

A thin film transistor array panel according to another exemplary embodiment of the present invention includes: a substrate; a gate line formed on the substrate; a gate insulating layer formed on the gate line: a data line formed on the gate insulating layer; a passivation layer formed on the gate insulating layer and the data line; a data contact assistant formed on the passivation layer; and a data identification member close to the data pad and formed with the same layer as the data pad, wherein the data contact assistant at least partially overlaps the data identification member.

According to the present invention, a gate identification member is formed without producing a step in a corresponding gate contact assistant, thus reducing the risk of defects when wires or other objects are pressed onto the gate pad.

Also, a data identification member is formed without producing a step in a corresponding data contact assistant, thus reducing the risk of defects when wires or other objects are pressed onto the data pad.

Further, the identification number is not formed between the gate pads or the data pads, reducing the risk that neighboring pads will be shorted to each other.

BRIEF DESCRIPTION OF THE DRAWINGS

Like reference numerals refer to corresponding parts throughout the drawings.

DETAILED DESCRIPTION OF EMBODIMENTS

Figure 1:
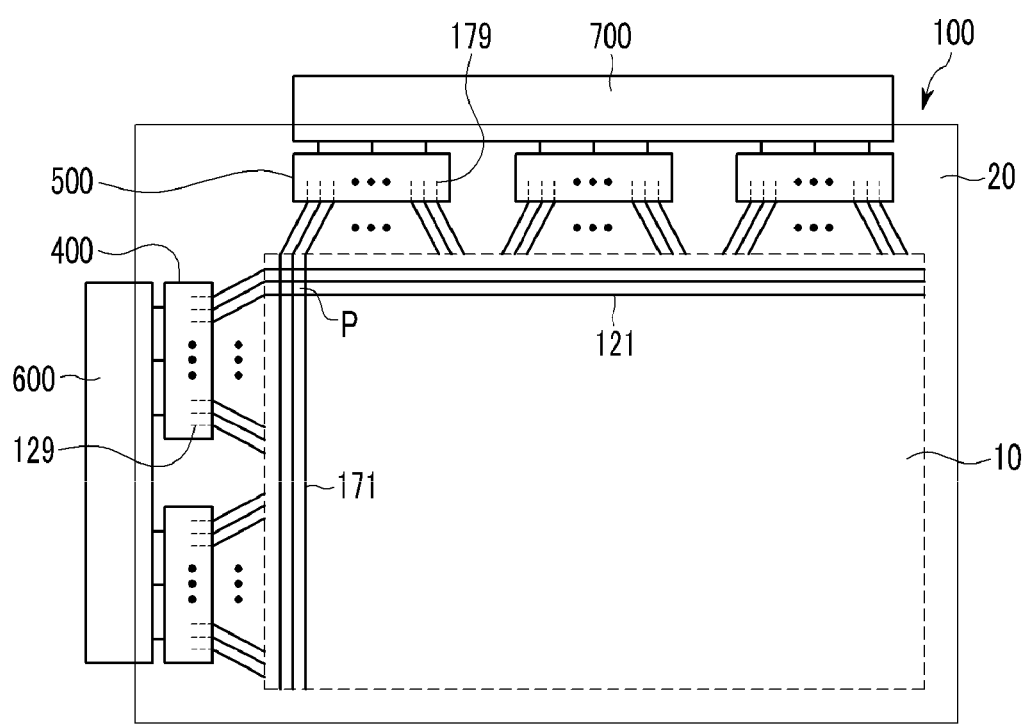
FIG. 1 is a top plan view showing a schematic structure of a thin film transistor array panel according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, a thin film transistor array panel according to an exemplary embodiment of the present invention will be described with reference to accompanying drawings.

FIG. 1 is a top plan view showing a schematic structure of a thin film transistor array panel according to an exemplary embodiment of the present invention.

As shown in FIG. 1, the thin film transistor array panel is divided into a display area 10 displaying images inside a dotted line, and a non-display area 20 outside the dotted line.

In the display area 10, a plurality of gate lines 121 and data lines 171 are formed. The gate lines 121 and the data lines 171 are crossed, thereby defining pixel areas P. Although not shown, a thin film transistor is positioned where the gate lines 121 and the data lines 171 cross. The thin film transistor switches a signal applied to a pixel electrode of the display area, thereby displaying images.

Figure 2:
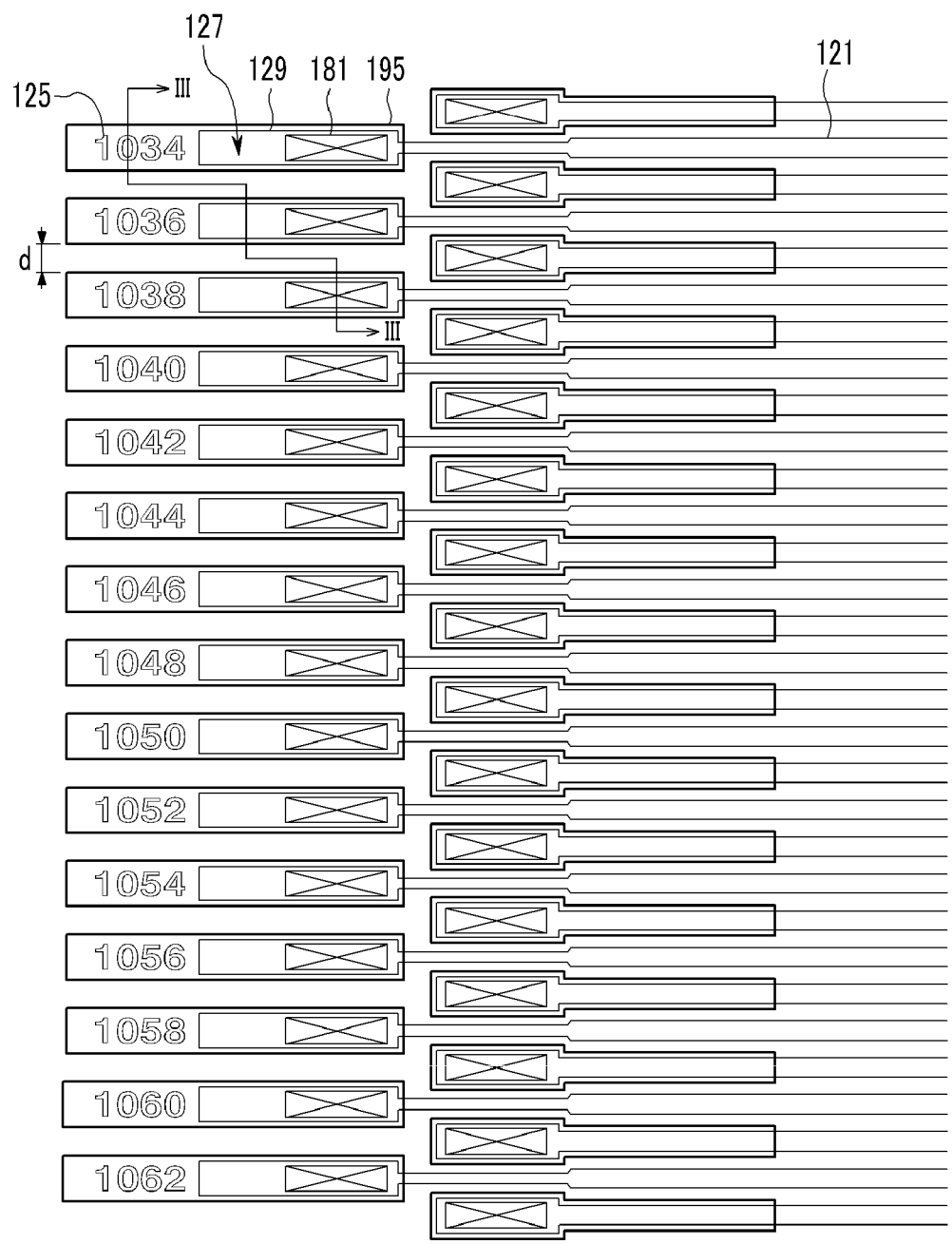
FIG. 2 is an enlarged layout view a gate pad shown in FIG. 1.

In the non-display area 20, gate pads 129 and data pads 179 are formed and connected, respectively, to the ends of the gate lines 121 and the data lines 171. The gate pads 129 and the data pads 179 are connected to a gate driving chip 400 and a data driving chip 500, respectively. The data driving chip 500 is mounted on the non-display area 20. The gate driving chip 400 and the data driving chip 500 are each connected to one or more external printed circuit boards (PCBs) (not shown), through FPC films 600 and 700. The printed circuit board PCB(s) include a plurality of elements such as ICs formed thereon, thereby generating various control signals and data signals to drive the liquid crystal display. Here, the printed circuit board PCB(s) are divided into gate units and data units. These gate and data units are respectively connected to each other through the FPC films 600 and 700, such that the gate signals are transmitted to the gate driving chip 400 and the data signals are transmitted to the data driving chip 500. FIG. 2 is an enlarged layout view of one of the gate pads shown in FIG. 1, and FIG. 3 is a cross-sectional view taken along the line III-III in FIG. 2.

Figure 3:
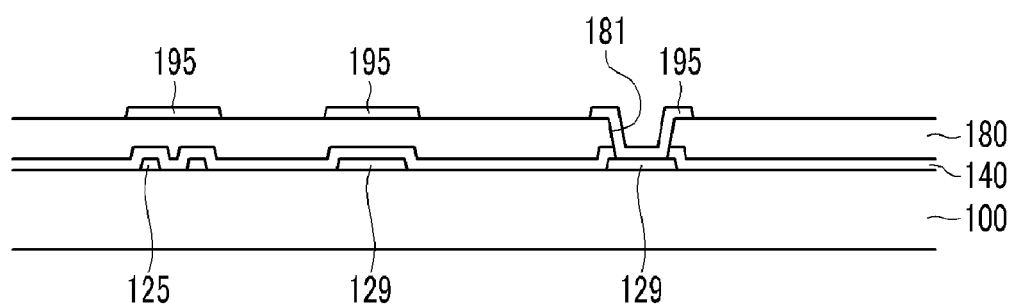
FIG. 3 is a cross-sectional view taken along the line III-III in FIG. 2.

As shown in FIG. 2 and FIG. 3, a plurality of gate lines 121, gate pads 129, and gate identification members 125 are each formed on an insulation substrate 100, which is made of transparent glass or plastic, in the non-display area 20.

The gate lines 121 are formed in the display area 10, but each has an expansion that is extended to the non-display area 20. More specifically, a plurality of gate pads 129 maintaining a predetermined interval d are connected to the ends of the plurality of gate line 121. These gate pads 129 have a greater width than that of their respective gate lines 121, facilitating easier contact with the gate driving chip 400. The gate pad 129 includes a contact hole 181 for contact with the terminal of the gate driving chip 400, and a probe contact portion 127 for contact with the tip of a probe used in defect inspection.

The gate identification member 125 is formed relatively close to the gate pad 129, along the major axis of the gate pad 129. The gate identification member 125 may be formed of the same material as the gate pad 129, and the gate lines 121, the gate pads 129, and the gate identification member 125 may be made of a metal such as an aluminum-containing metal of aluminum (Al) or an aluminum alloy, a silver-containing metal of silver (Ag) or a silver alloy, a copper-containing metal of copper (Cu) or a copper alloy, a molybdenum-containing metal of molybdenum (Mo) or a molybdenum alloy, chromium (Cr), tantalum (Ta), and titanium (Ti).

When detecting a defective pixel, if the gate identification members 125 are not present, the gate lines 121 must typically be counted from the start, making the defect inspection process time-consuming and overly difficult. The gate identification members 125 are formed and placed so as to allow for ready identification of the pads, so as to substantially solve this problem.

The gate identification member 125 can be formed at any distance from its corresponding gate pad, so long as it can still be readily identified with its gate pad. Further, while each gate identification member 125 is shown in FIG. 2 as lying parallel to, and along, the major axis of its corresponding gate pad, the invention contemplates any orientation and position of each member 125, so long as the members 125 are readily associated with their corresponding pads.

The gate identification member 125 can be formed as a number, a symbol, or any other unique identifier for each gate line 121, allowing for one to more easily obtain information during defect inspection.

A gate insulating layer 140 is formed on the gate line 121, the gate pad 129, and the gate identification member 125. The gate insulating layer 140 can be made of silicon nitride (SiNx), silicon oxide ($SiO_2$), or any other suitable insulating material.

A passivation layer 180 is formed on the gate insulating layer 140. The passivation layer can be any suitable organic or inorganic insulator. The gate insulating layer 140 and the passivation layer 180 have a contact hole 181 formed therein, exposing a portion of the gate pad 129 of the gate line 121.

A gate contact assistant 195 is formed on the passivation layer 180, and is connected to the gate pad 129 of the gate line through the contact hole 181. The gate contact assistant 195 overlaps the gate pad 129 and the gate identification member 125. The gate contact assistant 195 is placed in electrical contact with the gate driving chip 400, so as to apply the gate driving signal to the gate line 121. While the gate contact assistant 195 is shown here as overlapping the entirety of the gate identification member 125, the invention is not limited to any such configuration, and includes embodiments in which the gate contact assistant only partially overlaps the gate identification member 125.

As described above, the gate identification member 125 is made of the same material, and in the same layer, as the gate pad 129. Member 125 also lies under the gate contact assistant 195, allowing the gate identification member 125 to be made relatively large. Accordingly, the gate identification member 125 may be easily confirmed from the outside during defect inspection. Also, as the members 125 are not formed between neighboring gate pads 129, the members 125 do not significantly increase the risk of shorting neighboring pads to each other.

The above configurations of gate identification members 125 can be equally applied to data pads 179. To that end, FIG. 4 illustrates an enlarged layout view a data pad shown in FIG. 1, and FIG. 5 is a cross-sectional view taken along the line V-V in FIG. 4.

Figure 4:
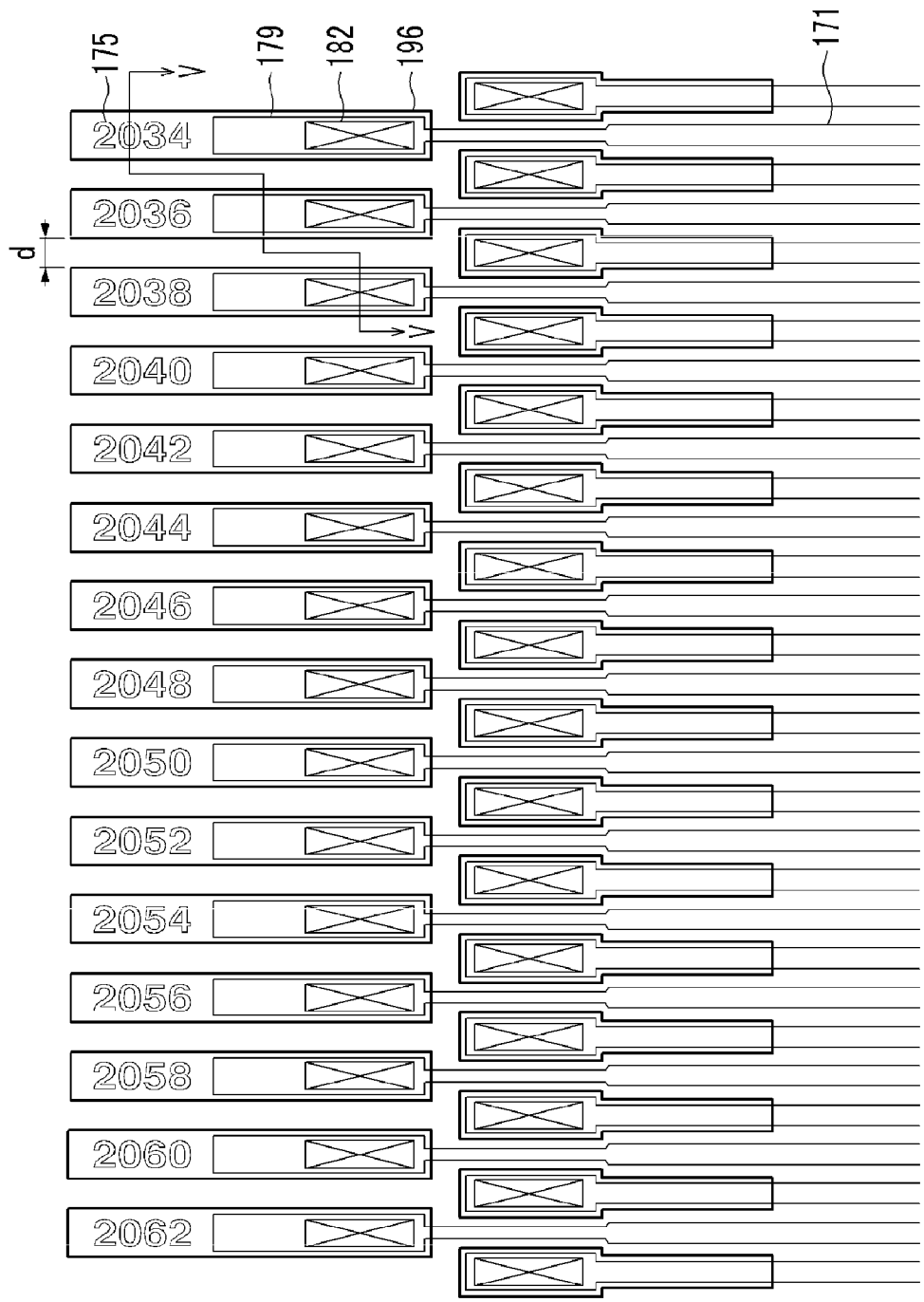
FIG. 4 is an enlarged layout view a data pad shown in FIG. 1.
Figure 5:
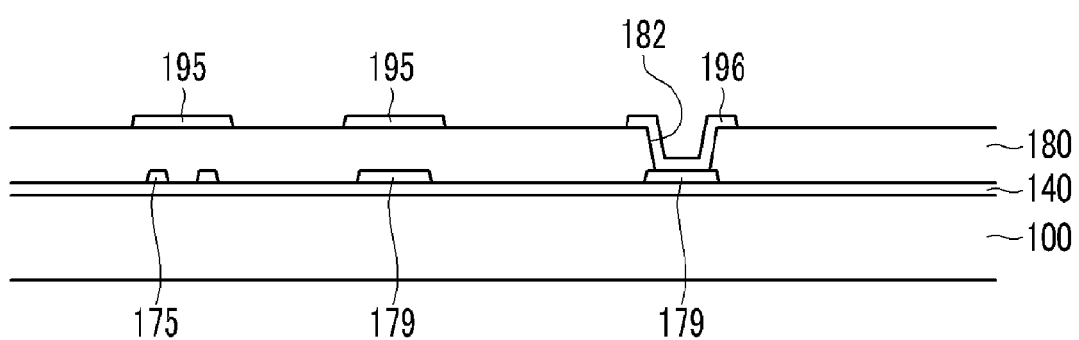
FIG. 5 is a cross-sectional view taken along the line V-V in FIG. 4.

As shown in FIG. 4 and FIG. 5, the gate insulating layer 140 is formed on the insulation substrate 100, and can be made of silicon nitride (SiNx) or silicon oxide ($SiO_2$). The insulation substrate 100 can be made of transparent glass or plastic at the non-display area 20.

A plurality of data lines 171, data pads 179, and data identification members 175 are formed on the gate insulating layer 140.

The data lines 171 are formed in the display area 10, but each has an expansion formed in the non-display area 20 for electrically connecting the data pads 179 and the data lines 171 to the data unit(s). Data pads 179 are formed on the ends of the data lines 171. Neighboring data pads 179 are formed with a predetermined interval d therebetween. The data pads 179 are wider than the data lines 171, facilitating easier contact with the data driving chip 400. Also, the data identification members 175 are formed relatively close to the data pads 179, along the major axis of the data pads 179. The data identification members 175 may be made of the same material as the data pads 179, and the data lines 171 may be made of a metal such as an aluminum-containing metal of aluminum (Al) or an aluminum alloy, a silver-containing metal of silver (Ag) or a silver alloy, a copper-containing metal of copper (Cu) or a copper alloy, a molybdenum-containing metal of molybdenum (Mo) or a molybdenum alloy, chromium (Cr), tantalum (Ta), and titanium (Ti).

The data identification member 175 is formed as a number, a symbol, or any other unique identifier for each data line 171 that allows for one to more readily obtain information during defect inspection.

A passivation layer 180 made of an inorganic insulating layer or an organic insulator is formed on the data lines 171, the data pads 179, and the data identification members 175. The passivation layer 180 can be made of an inorganic insulating layer or an organic insulator, and has a contact hole 182 exposing a portion of the data pad 179 of the data line 171.

A data contact assistant 196 is formed on the passivation layer 180, and is connected to the data pad 179 of the data line 171 through the contact hole 182. The data contact assistant 196 overlaps the data pad 179 and the data identification member 175. The data contact assistants 196 are electrically connected to the data driving chip 500, thereby applying the data driving signal to the data line 171. While the data contact assistant 196 is shown here as overlapping the entirety of the data identification member 175, the invention is not limited to any such configuration, and includes embodiments in which the data contact assistant only partially overlaps the data identification member 175.

As described above, the data identification member 175 can be made of the same material, and in the same layer as, the data pad 179, and overlaps the data contact assistant 196 such that the data identification member 175 may be made relatively large. Accordingly, the data identification member 175 may be easily confirmed from the outside during defect inspection. Also, as the members 175 are not formed between neighboring data pads 179, the members 175 do not significantly increase the risk of shorting neighboring pads to each other.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   a substrate;
   a gate line formed on the substrate;
   a gate pad formed at an end of the gate line;
   a gate identification member corresponding to the gate pad and formed adjacent to the corresponding gate pad, the gate identification member having an identifier identifying the gate pad, the identifier comprising the same material as the gate pad;
   a gate insulating layer covering the gate line and the gate identification member;
   a data line formed on the gate insulating layer;
   a passivation layer formed on the gate insulating layer and the data line;
   a gate contact assistant formed on the passivation layer; and
   a gate driving chip electrically connected to the gate contact assistant,
   wherein the gate contact assistant at least partially overlaps the gate identification member.

2. The thin film transistor array panel of claim 1, further comprising:
   a gate contact hole formed in the gate insulating layer and the passivation layer, and
   wherein the gate pad is connected to the gate contact assistant through the gate contact hole.

3. The thin film transistor array panel of claim 2, wherein:
   the gate identification member comprises the same material as the gate pad.

4. The thin film transistor array panel of claim 3, wherein:
   the gate identification member comprises an identification number.

5. The thin film transistor array panel of claim 3, wherein:
   the gate identification member is oriented along a major axis of the gate pad.

6. The thin film transistor array panel of claim 1, further comprising:
   a data contact assistant formed on the passivation layer; and
   a data identification member corresponding to the data pad and formed adjacent to the corresponding data pad,
   wherein the data contact assistant at least partially overlaps the data identification member.

7. The thin film transistor array panel of claim 6, further comprising:
a data driving chip electrically connected to the data contact assistant, and
a data contact hole formed in the passivation layer.

8. The thin film transistor array panel of claim 7, wherein:
the data pad is connected to the data contact assistant through the data contact hole.

9. The thin film transistor array panel of claim 8, wherein:
the data identification member comprises the same material as the data pad.

10. The thin film transistor array panel of claim 9, wherein:
the data identification member comprises an identification number.

11. The thin film transistor array panel of claim 9, wherein:
the data identification member is oriented along a major axis of the data pad.

12. A thin film transistor array panel comprising:
a substrate;
a gate line formed on the substrate;
a gate insulating layer formed on the gate line;
a data line formed on the gate insulating layer and having a data pad extending therefrom;
a passivation layer formed on the gate insulating layer and the data line;
a data contact assistant formed on the passivation layer; and
a data identification member close to the data pad and formed with the same layer as the data pad, the data identification member having an identifier identifying the data pad, the identifier comprising the same material as the data pad,
wherein the data contact assistant at least partially overlaps the data identification member.

13. The thin film transistor array panel of claim 12, further comprising:
a data driving chip electrically connected to the data contact assistant, and
a data contact hole formed in the passivation layer.

14. The thin film transistor array panel of claim 13, wherein:
the data pad is connected to the data contact assistant through the data contact hole.

15. The thin film transistor array panel of claim 14, wherein:
the data identification member comprises an identification number.

16. The thin film transistor array panel of claim 15, wherein:
the data identification member is oriented along a major axis of the data pad.

17. The thin film transistor array panel of claim 1, wherein:
the gate contact assistant and the gate pad entirely overlap the gate identification member, and
the gate contact assistant is connected to the gate pad.

18. The thin film transistor array panel of claim 1, wherein:
the gate pad and the gate identification member are separated from each other.

19. The thin film transistor array panel of claim 12, wherein:
the data contact assistant and the data pad entirely overlap the data identification member, and
the data contact assistant is connected to the data pad.

20. The thin film transistor array panel of claim 12, wherein:
the data pad and the data identification member are separated from each other.

* * * * *